United States Patent
Gordon et al.

(10) Patent No.: US 11,538,977 B2
(45) Date of Patent: Dec. 27, 2022

(54) QUBITS WITH ION IMPLANT JOSEPHSON JUNCTIONS

(71) Applicant: International Business Machines Corporation, Armonk, NY (US)

(72) Inventors: Ryan T. Gordon, Yorktown Heights, NY (US); Kenneth P. Rodbell, Sandy Hook, CT (US); Robert L. Sandstrom, Chestnut Ridge, NY (US); Jeffrey W. Sleight, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 44 days.

(21) Appl. No.: 17/116,125

(22) Filed: Dec. 9, 2020

(65) Prior Publication Data
US 2022/0181536 A1 Jun. 9, 2022

(51) Int. Cl.
*H01L 39/22* (2006.01)
*H01L 39/24* (2006.01)
*H01L 39/12* (2006.01)

(52) U.S. Cl.
CPC ............ *H01L 39/223* (2013.01); *H01L 39/12* (2013.01); *H01L 39/2406* (2013.01); *H01L 39/2493* (2013.01)

(58) Field of Classification Search
CPC ... H01L 39/223; H01L 39/12; H01L 39/2406; H01L 39/2493
See application file for complete search history.

(56) References Cited

U.S. PATENT DOCUMENTS

| | | | |
|---|---|---|---|
| 4,490,901 A | 1/1985 | Clark et al. | |
| 5,077,266 A | 12/1991 | Takagi et al. | |
| 7,042,005 B2 | 5/2006 | Il'ichev et al. | |
| 9,559,284 B2 | 1/2017 | Chang et al. | |
| 10,147,865 B1 | 12/2018 | Tahan et al. | |
| 10,177,297 B2 | 1/2019 | Marcus et al. | |
| 10,453,894 B2 | 10/2019 | Ladizinsky et al. | |
| 10,593,879 B2 | 3/2020 | Schrade et al. | |
| 2019/0385673 A1 | 12/2019 | Bosman | |

FOREIGN PATENT DOCUMENTS

JP 2012015878 A 1/2012
RU 2376686 C1 * 12/2009

OTHER PUBLICATIONS

Arrington et al. "Superconducting weak links formed by ion implantation" Applied Physics Letters 26, 204 (1975); doi: 10.1063/1.88116, 4 pages.

(Continued)

*Primary Examiner* — Matthew L Reames
(74) *Attorney, Agent, or Firm* — Amin, Turocy & Watson, LLP

(57) ABSTRACT

Techniques regarding qubit structures comprising ion implanted Josephson junctions are provided. For example, one or more embodiments described herein can comprise an apparatus that can include a strip of superconducting material coupling a first superconducting electrode and a second superconducting electrode. The strip of superconducting material can have a first region comprising an ion implant and a second region that is free from the ion implant.

20 Claims, 12 Drawing Sheets

(56) References Cited

OTHER PUBLICATIONS

Rogers et al. "Electron trap states and low frequency noise in tunnel junctions" IEEE Transactions on Magnetics, 1987 vol. 23; Iss. 2, 4 pages.
Clark et al. "Ion Implantation into Nb/NbO/PbAuIn Josephson Tunnel Junctions" vol. 27 (Symposium E—Ion Implantation and Ion Beam Processing of Materials)1983 , 577, DOI: https://doi.org/10.1557/PROC-27-577, Published online by Cambridge University Press: Feb. 25, 2011, 6 pages.
Josephson "Possible new effects in superconductive tunnelling" Physics Letter, vol. 1, Issue 7, Jul. 1, 1962, pp. 251-253, 3 pages.

* cited by examiner

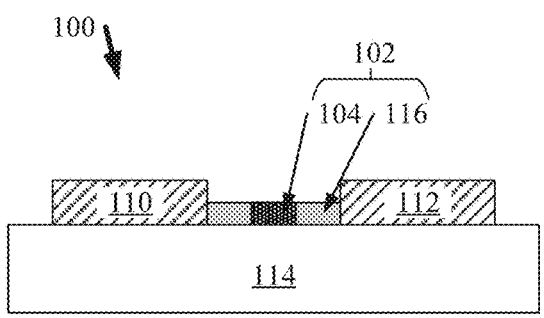
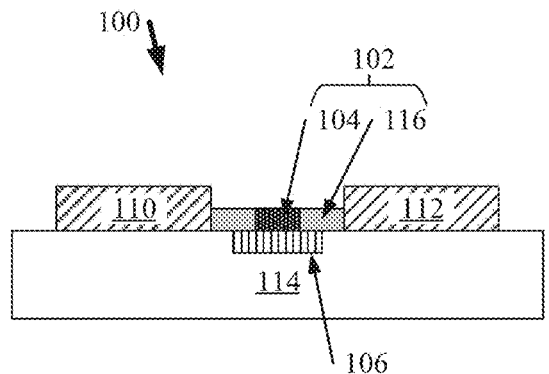
FIG. 1A
FIG. 1B
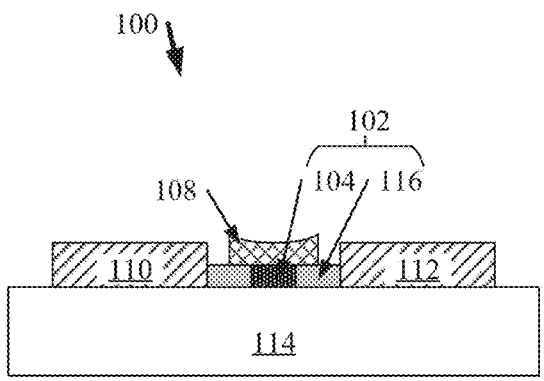
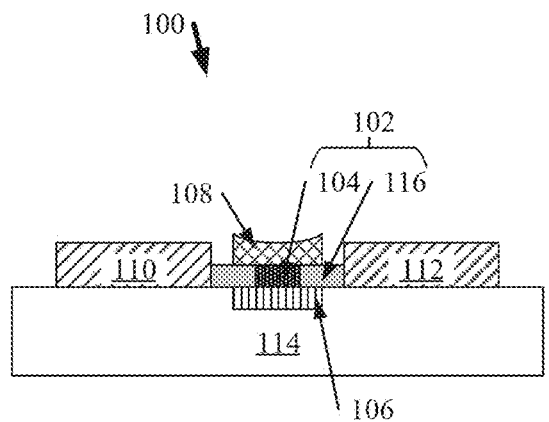
FIG. 1C
FIG. 1D

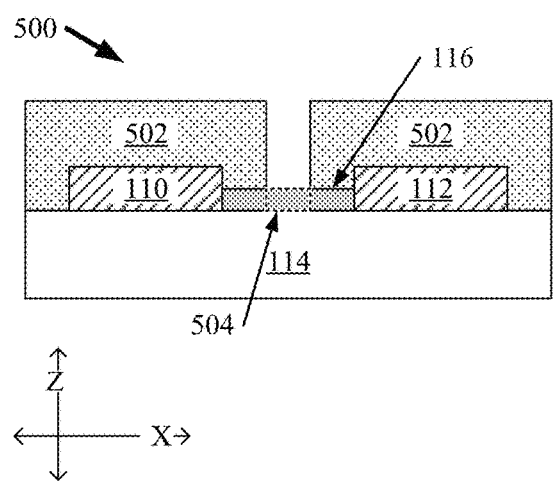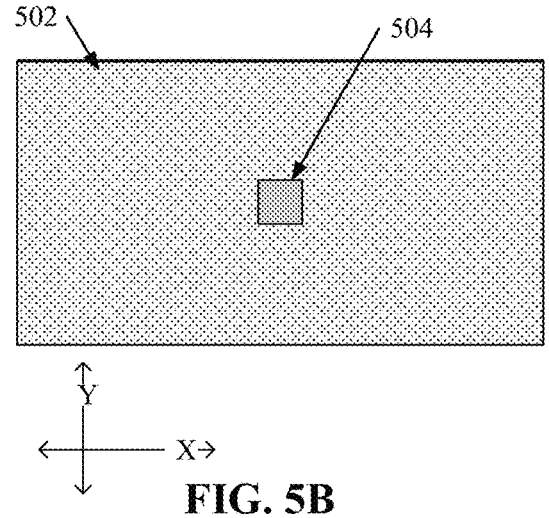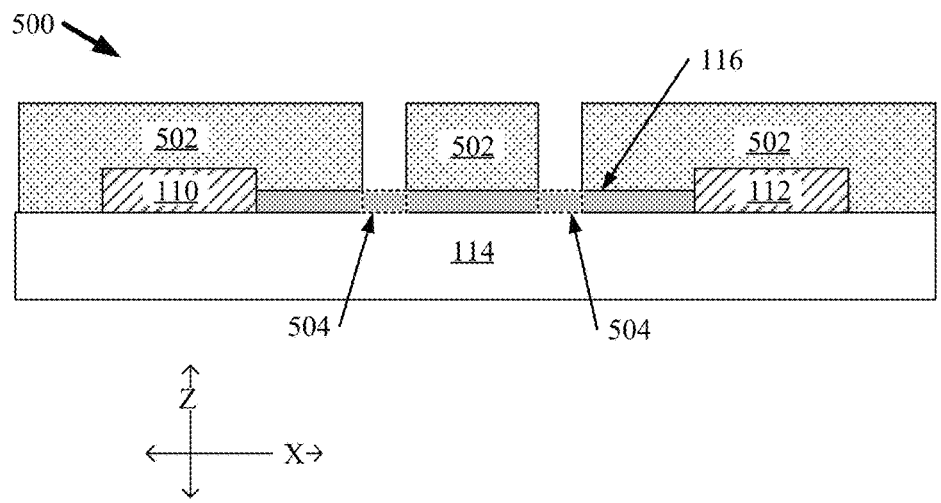
FIG. 5A
FIG. 5B
FIG. 5C

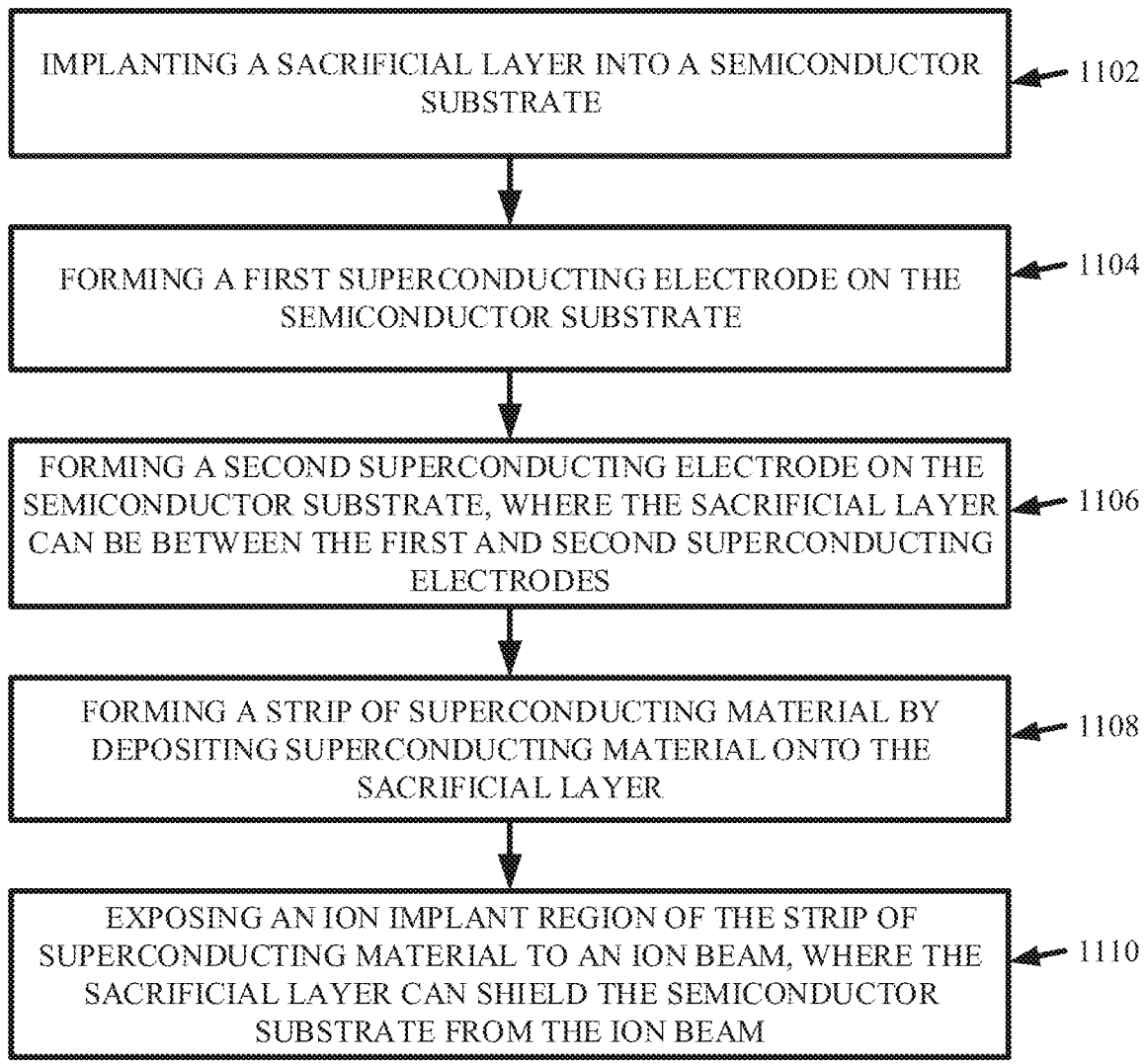

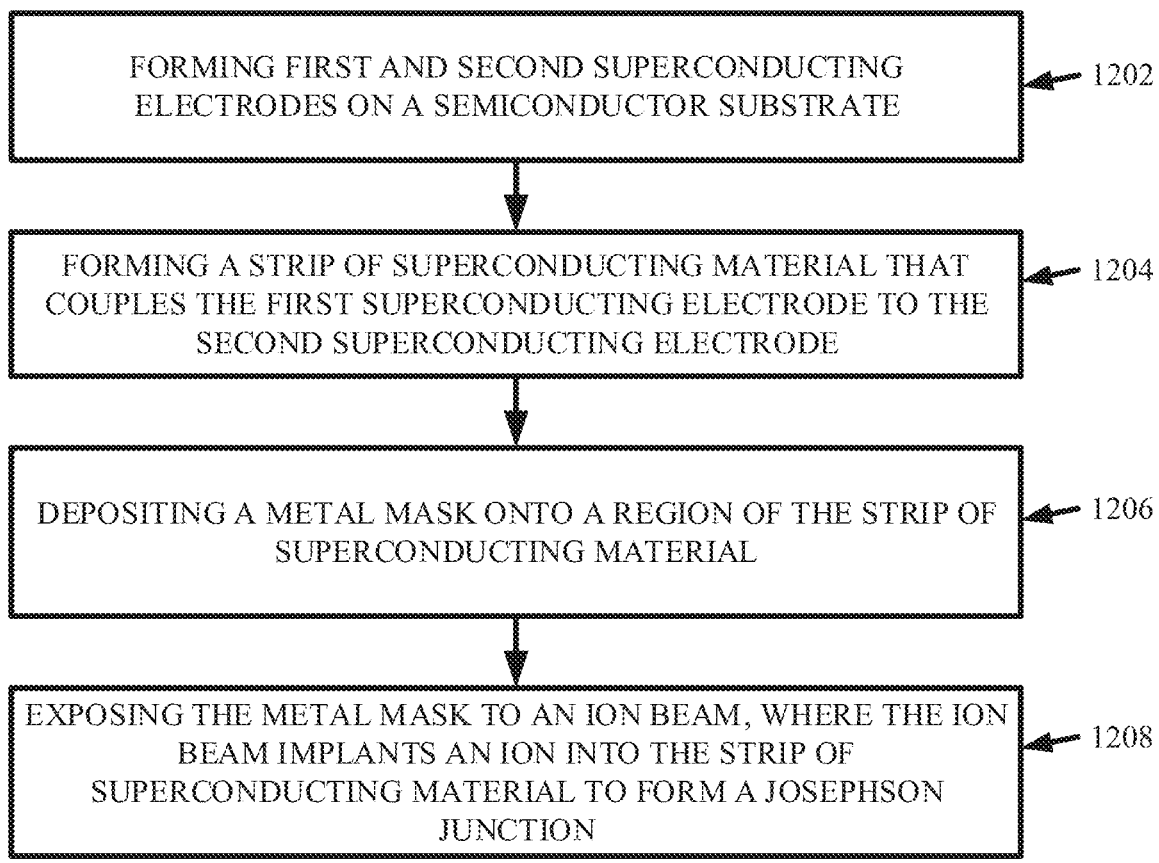

QUBITS WITH ION IMPLANT JOSEPHSON JUNCTIONS

BACKGROUND

The subject disclosure relates to one or more qubits having Josephson junctions formed from ion implantations, and more specifically, one or more superconducting qubits that can include one or more Josephson junctions that have weak links formed from ion implantations.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods regarding qubit structures with ion implant Josephson junctions are described.

According to an embodiment, an apparatus is provided. The apparatus can comprise a strip of superconducting material coupling a first superconducting electrode and a second superconducting electrode. The strip of superconducting material can have a first region comprising an ion implant and a second region that is free from the ion implant According to an embodiment, a method is provided. The method can comprise forming a Josephson junction of a superconducting qubit by implanting an ion into a region of a strip of superconducting material. The strip of superconducting material can couple a first superconducting electrode to a second superconducting electrode.

According to another embodiment, a method is provided. The method can comprise forming a first superconducting electrode and a second superconducting electrode on a substrate. The method can also comprise forming a strip of superconducting material that can couple the first superconducting electrode to the second superconducting electrode. The method can further comprise forming a Josephson junction in the strip of superconducting material by implanting an ion into the strip of superconducting material.

BRIEF DESCRIPTION OF THE DRAWINGS

FIGS. 1A-1D illustrate diagrams of example, non-limiting cross-sectional views of qubit structures that can include one or more Josephson junctions having one or more ion implant regions in accordance with one or more embodiments described herein.

FIGS. 5A-5C illustrates diagrams of an example, non-limiting qubit structure during a second stage of manufacturing in accordance with one or more embodiments described herein.

FIG. 11 illustrates a flow diagram of an example, non-limiting method that can facilitate manufacturing of one or more qubits via ion implantation in accordance with one or more embodiments described herein.

FIG. 12 illustrates a flow diagram of an example, non-limiting method that can facilitate manufacturing of one or more qubits via ion implantation in accordance with one or more embodiments described herein.

DETAILED DESCRIPTION

Figure 2A:
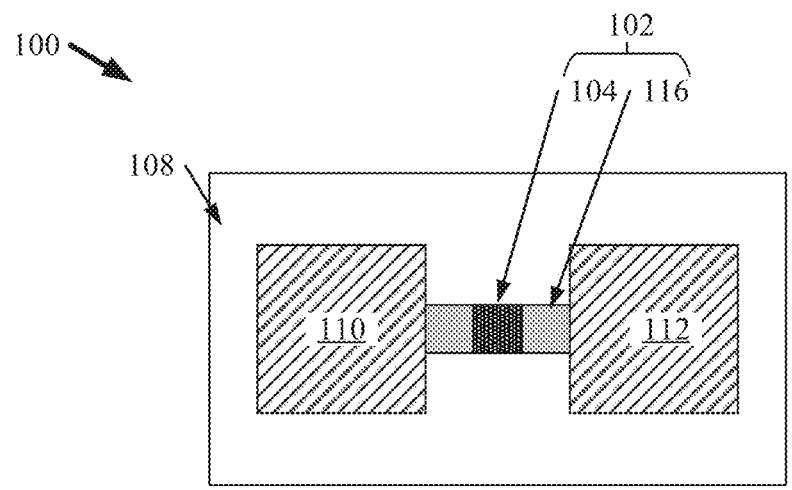
FIGS. 2A-2B illustrate diagrams of example, non-limiting top-down views of qubit structures that can be formed from one or more ion implantations in accordance with one or more embodiments described herein.
Figure 2A:
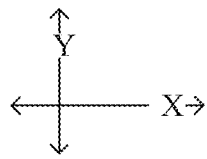

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading, cross-hatching, and/or coloring can comprise shared compositions and/or materials.

Superconducting qubits can include one or more Josephson junctions, which can achieve the Josephson tunneling effect by having two or more superconducting electrodes coupled weakly through an intermediate region where the superconducting order parameter is suppressed. Thereby, the intermediate region can constitute a weak link between the superconductors. The weak link can be formed from an insulator (e.g., thereby forming a superconductor-insulator-superconductor ("SIS") Josephson junction), a normal metal (e.g., thereby forming a superconductor-normal metal-superconductor ("SNS") Josephson junction), and/or a constriction between the superconductors (e.g., thereby forming a superconductor-constriction-superconductor "SCS") Josephson junction). Traditionally, superconducting qubits have one or more SIS Josephson junctions, where the weak link is formed from a thin oxide region.

Various embodiments described herein can regard qubit structures that can include one or more SCS Josephson junctions formed via ion implantation. For example, one or more qubit structures described herein can include one or more Josephson junctions, where the weak link can be formed from ions implanted into an intermediate region of a superconducting material coupling two or more superconducting electrodes. Thereby, the ion implants can establish a constriction within the superconducting material to form the weak link. In various embodiments, the ion implementation can be controlled via one or more sacrificial layers underlying the intermediate region and/or one or more metal caps positioned above the intermediate region. In one or more embodiments, Josephson junctions of the qubit structures described herein: can be subjected to annealing temperatures; can be comprised within pluralities of Josephson junctions formed on a common superconducting coupling line; and/or can be individually fabricated on a multi-qubit processor to enhance frequency control.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), pulse laser deposition ("PLD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein, the terms "lithography process" and/or "lithography processes" can refer to the formation of three-dimensional relief images or patterns on a substrate for subsequent transfer of the pattern to the substrate. For example, the patterns can be formed by a light sensitive polymer called a photoresist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

FIGS. 1A-1D illustrate diagrams of cross-sectional views of various embodiments of qubit structure 100 that can include one or more Josephson junction 102 comprising ion implant regions 104 as weak links in accordance with one or more embodiments described herein. Repetitive description of like elements employed in other embodiments described herein is omitted for sake of brevity. FIG. 1A can depict a first embodiment of the qubit structure 100 comprising one or more ion implant regions 104. FIG. 1B can depict a second embodiment of the qubit structure 100 comprising one or more ion implant regions 104 and/or one or more underlying sacrificial layers 106. FIG. 1C can depict a third embodiment of the qubit structure 100 comprising one or more ion implant regions 104 and/or one or more metal cap layers 108. Additionally, features of the various embodiments can be combined in one or more qubit structures 100 as exemplified in FIG. 1D, which depicts a fourth embodiment that includes the features of each of the embodiments shown in FIGS. 1A-C (e.g., one or more ion implant regions 104, sacrificial layers 106, and/or metal cap layers 108).

In the various embodiments described herein, the qubit structure 100 can comprise one or more Josephson junctions 102 coupled to a first superconducting electrode 110 and a second superconducting electrode 112. Additionally, the one or more Josephson junctions 102, first superconducting electrodes 110, and/or second superconducting electrodes 112 can be positioned on one or more substrates 114 (e.g., as shown in FIGS. 1A-1D).

The substrate 114 can be crystalline, semi-crystalline, microcrystalline, or amorphous. The substrate 114 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The substrate 114 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the substrate 114 can also have other layers, such as oxides with high dielectric constants ("high-K oxides") and/or nitrides. In one or more embodiments, the substrate 114 can be a silicon wafer. In various embodiments, the substrate 114 can comprise a single crystal silicon (Si), silicon germanium (e.g., characterized by the chemical formula SiGe), a Group III-V semiconductor wafer or surface/active layer, a combination thereof, and/or the like. In various embodiments, the substrate 114 can have an orientation that minimizes an amount of ion channeling exhibited during one or more ion implantations that form the one or more ion implant regions 104. For example, the orientation of the substrate 114 can be based on the ion species being implanted into the one or more ion implant regions 104 and/or the composition of the substrate 114.

The one or more first superconducting electrodes 110 and/or second superconducting electrodes 112 can be comprised of one or more superconducting materials. Example materials that can be comprised within the one or more first superconducting electrodes 110 and/or second superconducting electrodes 112 can include but are not limited to: aluminum, niobium, a combination thereof, and/or the like. In various embodiments, the one or more first superconducting electrodes 110 and second superconducting electrodes 112 can be comprised of substantially the same superconducting materials (e.g., can have essentially the same material composition) or can be comprised of different superconducting materials (e.g., can have different material compositions). For example, the one or more first superconducting electrodes 110 and second superconducting electrodes 112 can both comprise aluminum (e.g., as shown in FIGS. 1A-1D).

One or more Josephson junctions 102 can couple the one or more first superconducting electrodes 110 to the one or more second superconducting electrodes 112. The one or more Josephson junctions 102 can comprise a superconducting coupling line 116 and an ion implant region 104. The ion implant region 104 can be the weak link of the respective Josephson junction 102. For example, the one or more Josephson junctions 102 can be SCS Josephson junctions, where the ion implant region 104 is the constriction element.

The superconducting coupling line 116 can be a strip of superconducting material extending from the one or more first superconducting electrodes 110 to the one or more second superconducting electrodes 112. Further, the superconducting coupling line 116 can comprise one or more superconducting materials. Example materials that can be comprised within the superconducting coupling line 116 can include but are not limited to: aluminum, niobium, a combination thereof, and/or the like. In various embodiments, the superconducting coupling line 116 can have substantially the same material composition as the one or more first superconducting electrodes 110 and/or second superconducting electrodes 112. In another instance, the superconducting coupling line 116 can have a different material composition as the one or more first superconducting electrodes 110 and/or second superconducting electrodes 112. For example, the one or more first superconducting electrodes 110 and second superconducting electrodes 112 can both comprise aluminum, whereas the superconducting coupling line 116 can comprise niobium (e.g., as shown in FIGS. 1A-1D). In a further instance, the superconducting coupling line 116 can have the same material composition as the first superconducting electrode 110 and a different material composition than the second superconducting electrode 112.

The dimensions of the superconducting coupling line 116 can vary depending on the function of the respective qubit structure 100. For example, the superconducting coupling line 116 can have a length (e.g., along the "X" axis shown in FIGS. 1A-1D) greater than or equal to 1 micrometer (μm) and less than or equal to 500 μm. Additionally, the superconducting coupling line 116 can have a thickness (e.g., along the "Z" axis shown in FIGS. 1A-1D) greater than, for example, 1 μm and less than or equal to 100 μm.

As shown in FIGS. 1A-1D, one or more intermediate regions of the superconducting coupling line 116 can be ion implant regions 104. The one or more ion implant regions 104 can include ions implanted into the superconducting material of the superconducting coupling line 116. Example ions that can be comprised within the one or more ion implant regions 104 can include, but are not limited to: aluminum (Al), iron (Fe), tin (Sn), cobalt (Co), a combination thereof, and/or the like. For instance, the superconducting coupling line 116 can be a niobium line, where the ion implant region 104 can comprise aluminum ion implants. In various embodiments, the ion implants can be localized to the one or more ion implant region 104, where other regions of the superconducting coupling line 116 can be free from the ion implants. The ions can suppress the superconducting order parameter of the superconducting coupling line 116 within the intermediate region defined by the ion implant region 104.

In various embodiments, the ions can be implanted throughout the entire, or substantially the entire, thickness (e.g., along the "Z" direction) of the superconducting coupling line 116. Additionally, the dimensions of the ion implant region 104 can vary depending on the function of the respective qubit structure 100. For example, the one or more ion implant regions 104 can have a length (e.g., along the "X" axis shown in FIGS. 1A-1D) greater than or equal to 10 nanometers (nm) and less than or equal to 10 μm.

In one or more embodiments, the qubit structure 100 can further include one or more sacrificial layers 106 positioned under the one or more ion implant regions 104. The one or more sacrificial layers 106 can shield the substrate 114 from the ions being implanted into the superconducting coupling line 116 during formation of the one or more ion implant regions 104. As shown in FIG. 1B, the one or more sacrificial layers 106 can be implanted into the substrate 114 underlying the one or more ion implant regions 104. In various embodiments, the one or more sacrificial layers 106 can be comprised of one or more materials that can absorb the ions that pass through the ion implant region 104. Additionally, the one or more sacrificial layers 106 can be comprised of a material that can be removed after the ion implantation that forms the ion implant region 104. For instance, the one or more sacrificial layers 106 can be subsequently removed via one or more removal processes. Example materials that can be comprised within the one or more sacrificial layers 106 can include, but are not limited to: a photoresist, a low temperature oxide (e.g., tetraethyl orthosilicate ("TEOS"), silane oxide, and/or the like), a combination thereof, and/or the like.

In one or more embodiments, the qubit structure 100 can further include one or more metal cap layers 108 positioned above the one or more ion implant regions 104. The one or more metal cap layers 108 can be used to enhance control over ion implantation vertically (e.g., along the "Z" axis shown in FIG. 1C) and/or laterally (e.g., along the "X" axis shown in FIG. 1C) during formation of the ion implant region 104. For instance, the one or more metal cap layers 108 can facilitate control over the depth of ion implantation such that the ion implant region 104 does not extend into the substrate 114 (e.g., such that the ions are not implanted into the substrate 114 during formation of the ion implant region 104). Additionally, the one or more metal cap layers 108 can facilitate control over the lateral straggle of the ions during the implantation that forms the one or more ion implant regions 104 (e.g., can facilitate control over ion migration along the "X" axis shown in FIG. 1C). Example materials that can be comprised within the one or more metal cap layers 108 can include, but are not limited to: aluminum, tantalum, a metal nitride (e.g., titanium nitride (TiN), tantalum nitride (TaN), and/or the like), a combination thereof, and/or the like. In one or more embodiments, the metal cap layers 108 can comprise any metal and/or metal nitride suitable to protect the superconducting coupling line 116 from oxidation.

In various embodiments, the one or more metal cap layers 108 can have a circular or polygonal shape. For example, the one or more metal cap layers 108 can have a disc shape (e.g., as shown in FIG. 2B). The dimensions of the ion implant region 104 can vary depending on the function of the respective qubit structure 100. For example, the one or more metal cap layers 108 can have a length (e.g., along the "X" axis shown in FIGS. 1C-1D) greater than or equal to 10 nm and less than or equal to 10 µm. In one or more embodiments, the thickness (e.g., along the "Z" axis shown in FIG. 1C) of the one or more metal cap layers 108 can be substantially constant across the length (e.g., along the "X" axis shown in FIG. 1C) of the one or more metal cap layers 108. Alternatively, as shown in FIGS. 1C-1D, in one or more embodiments the thickness (e.g., along the "Z" axis shown in FIG. 1C) of the one or more metal cap layers 108 can vary across the length (e.g., along the "X" axis shown in FIG. 1C) of the one or more metal cap layers 108. For example, the one or more metal cap layers 108 can be thicker (e.g., along the "Z" axis shown in FIG. 1C) along the perimeter of the metal cap layers 108, as compared to a central region of the metal cap layers 108. An increased thickness of the one or more metal cap layers 108 along the perimeter can facilitate control over the vertical and/or lateral straggle of ions during the one or more ion implantations that form the one or more metal ion regions 104.

Figure 2B:
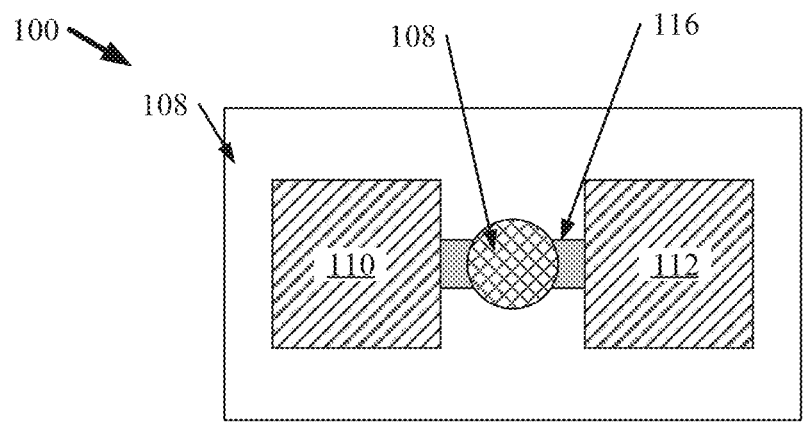
Figure 2B:
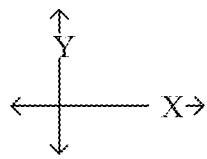

FIGS. 2A-2B illustrate diagrams of example, non-limiting top-down views of various embodiments of the qubit structure 100 in accordance with one or more embodiments describe herein. Repetitive description of like elements employed in other embodiments described herein is omitted for sake of brevity. FIG. 2A can depict a top-down view of the qubit structure 100 embodiments exemplified in FIGS. 1A-1B. FIG. 2B can depict a top-down view of the qubit structure 100 embodiments exemplified in FIGS. 1C-1D.

In various embodiments, the one or more first superconducting electrodes 110 and/or second superconducting electrodes 112 can have a width (e.g., along the "Y" axis shown in FIGS. 2A-2B) ranging, for example, from greater than or equal to 1 µm and less than or equal to 500 µm. In various embodiments, the superconducting coupling line 116 and/or ion implant region 104 can have a width (e.g., along the "Y" axis shown in FIGS. 2A-2B) ranging, for example, from greater than or equal to 1 µm and less than or equal to 500 µm. In various embodiments, the one or more metal cap layers 108 can have a width (e.g., along the "Y" axis shown in FIGS. 2A-2B) ranging, for example, from greater than or equal to 1 µm and less than or equal to 500 µm.

Figure 3:
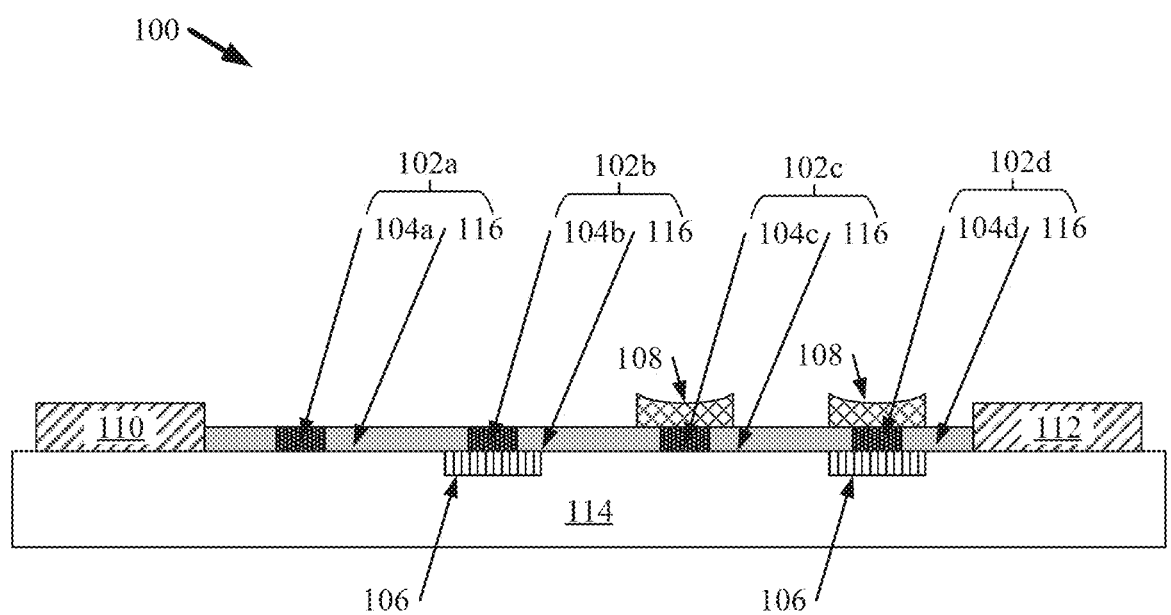
FIG. 3 illustrates a diagram of an example, non-limiting cross-sectional view of a qubit structure that can comprise multiple Josephson junctions having one or more ion implant regions in accordance with one or more embodiments described herein.

FIG. 3 illustrates a diagram of an example, non-limiting cross-sectional view of the qubit structure 100 comprising a plurality of Josephson junction 102 in accordance with one or more embodiments described herein. Repetitive description of like elements employed in other embodiments described herein is omitted for sake of brevity. As shown in FIG. 3, multiple ion implant regions 104 can be formed within separate intermediate regions of a common superconducting coupling line 116 to form a plurality of Josephson junctions 102. Also shown in FIG. 3, various structural and/or manufacturing embodiments described herein can be employed in conjunction with each other to achieve a multi-Josephson junction qubit structure 100 having respective Josephson junctions 102 that can exhibit distinct properties from one or more of the other Josephson junctions 102 within the same qubit structure 100.

In various embodiments, the plurality of Josephson junctions 102 comprised within a qubit structure 100 can exhibit the same structural architecture. For example, each of the plurality of Josephson junctions 102 can embody a structural architecture exemplified in FIGS. 1A, 1B, 1C, and/or 1D. Alternatively, the plurality of Josephson junctions 102 comprised within a qubit structure 100 can exhibit one or more respective structural architectures.

For example, FIG. 3 depicts a qubit structure 100 that includes four Josephson junctions 102, where each Josephson junction 102 can exemplify a respective embodiment depicted in FIGS. 1A-1D. For instance, the multi-Josephson junction qubit structure 100 exemplified in FIG. 3 can include a first Josephson junction 102a, a second Josephson junction 102b, a third Josephson junction 102c, and/or a fourth Josephson junction 102d. Each Josephson junction 102 can comprise a distinct ion implant region 104 (e.g., first Josephson junction 102a can include first ion implant region 104a, second Josephson junction 102b can include second ion implant region 104b, third Josephson junction 102c can include third ion implant region 104c, and/or fourth Josephson junction 102d can include fourth ion implant region 104d). In various embodiments, one or more of the respective ion implant regions 104 can comprise respective ion species or can comprise the same ion species.

In various embodiments, the presence of the one or more sacrificial layers 106 can enable a higher ion dose during the formation of an aligned ion implant region 104 due to at least the substrate 114 shielding provided by the sacrificial layer 106. For instance, the sacrificial layer 106 positioned under the second ion implant region 104b can enable a higher ion dose than the implantation employed with regards to the first ion implant region 104a. In another example, the presence of the one or more metal cap layers 108 can enable a higher ion dose during the formation of an aligned ion implant region 104 due to at least the ion migration control provided by the metal cap layer 108. Additionally, varying the thickness (e.g., along the "Z" direction shown in FIG. 3) and/or material composition of the metal cap layer 108 between respective Josephson junctions 102 can result in varying ion doses included in the respective ion implant regions 104.

Figure 4A:
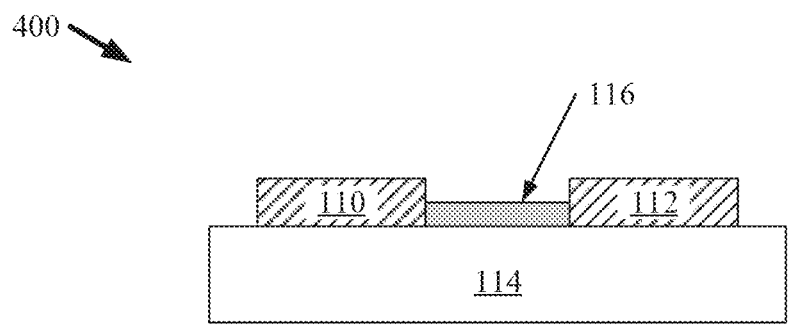
FIGS. 4A-B illustrate diagrams of example, non-limiting cross-sectional views of a qubit structure during a first stage of manufacturing in accordance with one or more embodiments described herein.
Figure 4B:
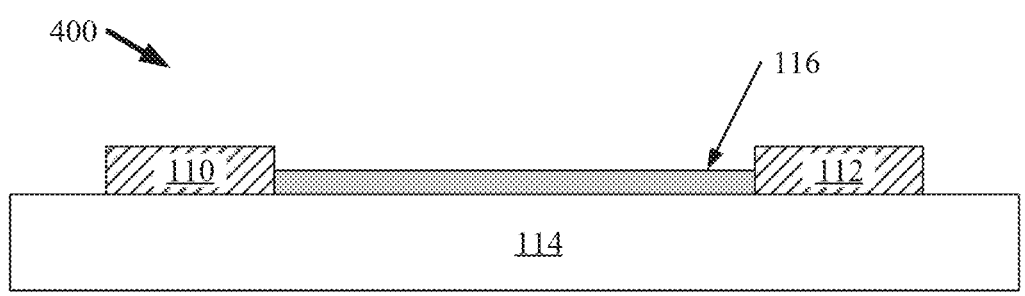

FIGS. 4A-4B illustrates diagrams of example, non-limiting cross-sectional views of the qubit structure 100 during a first stage 400 of manufacturing in accordance with one or more embodiments described herein. Repetitive description of like elements employed in other embodiments described herein is omitted for sake of brevity. FIG. 4A can depict an exemplary qubit structure 100 comprising a single Josephson junction 102 during a first stage 400 of manufacturing. FIG. 4B can depict an exemplary qubit structure 100 comprising multiple Josephson junctions 102 during the first stage 400 of manufacturing. FIG. 4B exemplifies that the manufacturing features described with regards to a single Josephson junction 102 can be extrapolated and/or scaled to facilitate the manufacturing of multiple Josephson junctions 102 on a common superconducting coupling line 116.

As shown in FIGS. 4A-4B, during the first stage 400 of manufacturing the one or more first superconducting electrodes 110, second superconducting electrodes 112, and/or superconducting coupling lines 116 can be deposited onto the substrate 114 via one or more deposition processes. In various embodiments, the geometry of the one or more first superconducting electrodes 110, second superconducting electrodes 112, and/or superconducting coupling lines 116 can be defined by one or more lithography processes.

FIGS. 5A and 5C illustrates diagrams of example, non-limiting cross-sectional views of the qubit structure 100 during a second stage 500 of manufacturing in accordance with one or more embodiments described herein. FIG. 5B illustrates a diagram of an example, non-limiting cross-sectional view of the qubit structure 100 during the second stage 500 of manufacturing in accordance with one or more embodiments described herein. Repetitive description of like elements employed in other embodiments described herein is omitted for sake of brevity. FIG. 5A can depict an exemplary qubit structure 100 comprising a single Josephson junction 102 during a second stage 500 of manufacturing from a cross-sectional perspective. FIG. 5B can depict an exemplary qubit structure 100 comprising a single Josephson junction 102 during a second stage 500 of manufacturing from a top-down perspective. FIG. 5C can depict an exemplary qubit structure 100 comprising multiple Josephson junctions 102 during the second stage 500 of manufacturing. FIG. 5C exemplifies that the manufacturing features described with regards to a single Josephson junction 102 can be extrapolated and/or scaled to facilitate the manufacturing of multiple Josephson junctions 102 on a common superconducting coupling line 116.

As shown in FIGS. 5A-5C, during the second stage 500 one or more mask layers 502 can be deposited onto the one or more first superconducting electrodes 110, second superconducting electrodes 112, and/or superconducting coupling lines 116 via one or more deposition processes. Thereby, the one or more mask layers 502 can cover the substrate 114 and/or one or more first superconducting electrodes 110 and/or second superconducting electrodes 112. As shown in FIGS. 5A-5C, the one or more mask layers 502 can be absent from one or more target intermediate regions 504 (e.g., delineated with dotted lines in FIGS. 5A-5C) of the one or more superconducting coupling lines 116. Thereby, the one or more target intermediate regions 504 of the superconducting coupling line 116 can remain exposed after the deposition of the one or more mask layers 502 during the second stage 500 of manufacturing. In various embodiments, the one or more target intermediate regions 504 can be positioned at points along the superconducting coupling line 116 designated for formation of the one or more ion implant regions 104.

In various embodiments, the one or more mask layers 502 can comprise hard mask materials. Example materials that can be comprised within the one or more mask layers 502 can include, but are not limited to: an oxide (e.g., silicon oxide), a nitride (e.g., silicon nitride), an oxynitride (e.g., silicon oxynitride), a combination thereof, and/or the like. In one or more embodiments, the one or more mask layers 502 can be deposited via one or more deposition processes. In some embodiments, the one or more mask layers 502 can be formed via a thermal process (e.g., oxidation and/or nitridation of top surface of the deposition area). A thickness (e.g., along the "Z" axis shown in FIGS. 5A and/or 5C) can vary based on an implantation profile to be employed when implanting the ion species into the superconducting coupling line 116.

Figure 6A:
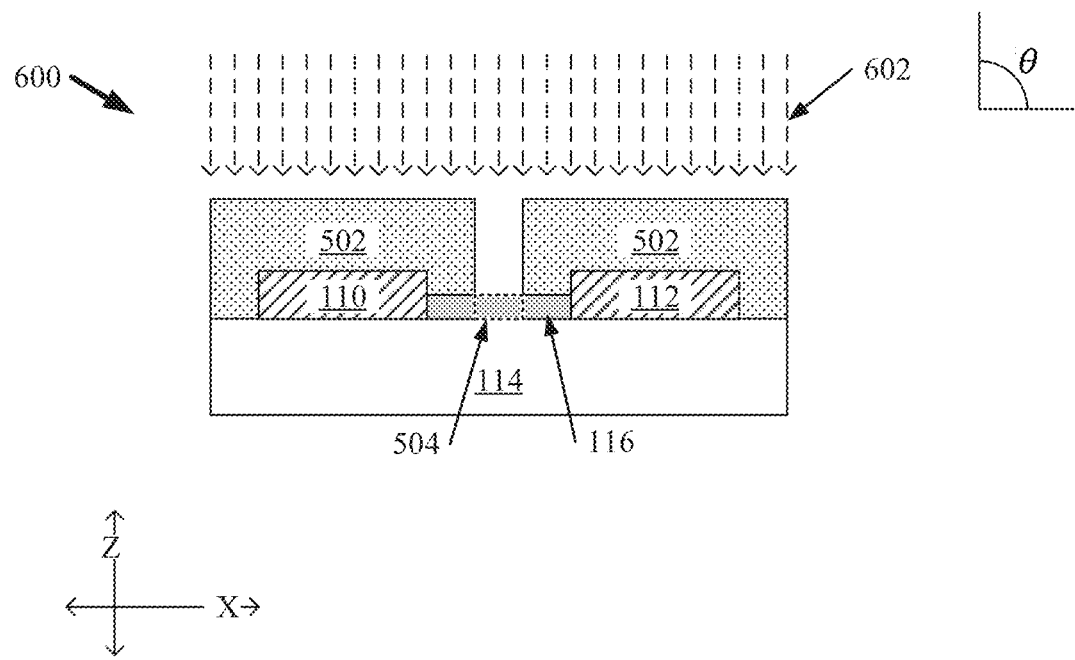
FIGS. 6A-6B illustrate diagrams of an example, non-limiting cross-sectional views of a qubit structure during a second stage of manufacturing in accordance with one or more embodiments described herein.
Figure 6B:
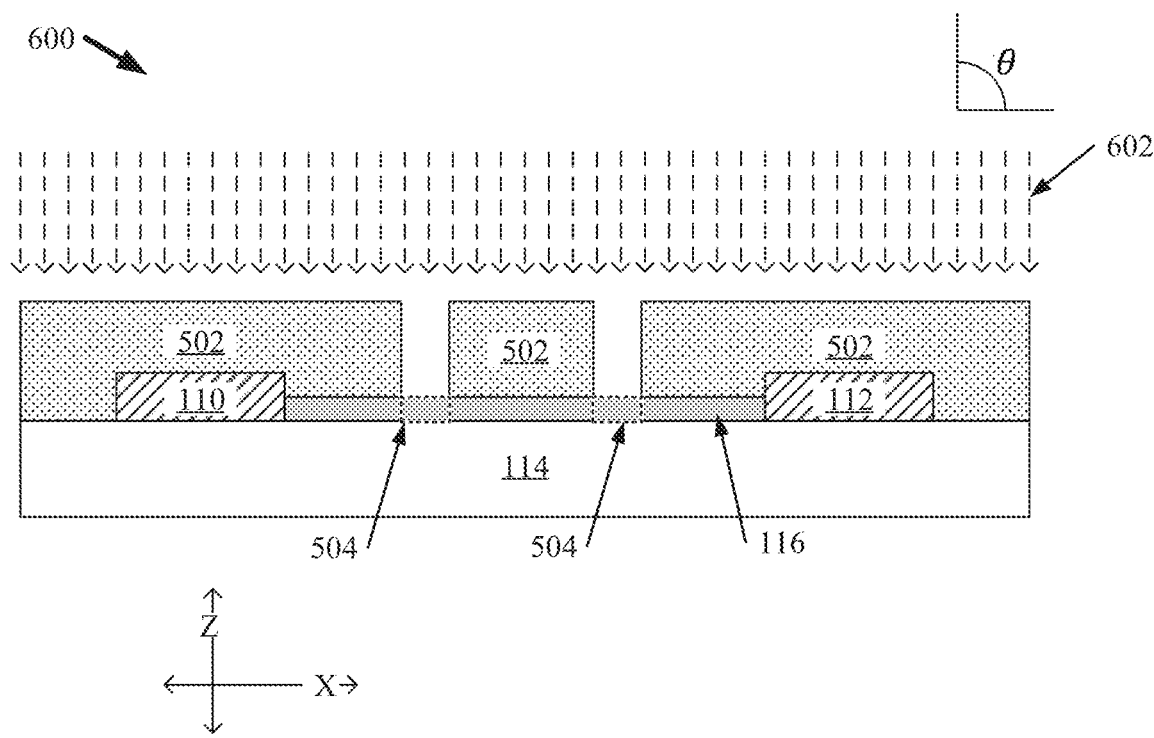

FIGS. 6A-6B illustrates diagrams of example, non-limiting cross-sectional views of the qubit structure 100 during a third stage 600 of manufacturing in accordance with one or more embodiments described herein. Repetitive description of like elements employed in other embodiments described herein is omitted for sake of brevity. FIG. 6A can depict an exemplary qubit structure 100 comprising a single Josephson junction 102 during a third stage 600 of manufacturing. FIG. 6B can depict an exemplary qubit structure 100 comprising multiple Josephson junctions 102 during the third stage 600 of manufacturing. FIG. 6B exemplifies that the manufacturing features described with regards to a single Josephson junction 102 can be extrapolated and/or scaled to facilitate the manufacturing of multiple Josephson junctions 102 on a common superconducting coupling line 116.

As shown in FIGS. 6A-6B, during the third stage 600 of manufacturing one or more ion implantations (e.g., bombarding a structural feature, such as the superconducting coupling line 116 and/or a metal cap layer 108, with ions of known energy to either deposit the ions within the structural feature or pass the ions through the structural feature) can be executed to form the one or more ion implant regions 104 at the one or more target intermediate regions 504. For example, the one or more mask layers 502 and/or exposed target intermediate regions 504 can be subjected to one or more ion beams 602 (e.g., represented by dashed arrows in FIGS. 6A-6B). The substrate 114, first superconducting electrode 110, second superconducting electrode 112, and/or portions of the superconducting coupling line 116 covered by the one or more mask layers 502 can be shielded from the one or more ion beams 602. Whereas the one or more ion beams 602 can implant the one or more ions into the one or more target intermediate regions 504 to form the one or more ion implant regions 104. Although FIGS. 6A-6B illustrates the ion beams 602 being employed at a 90-degree implantation angle (e.g., (e.g., represented by "θ" in FIGS. 6A-6B), the implantation angle can vary to further control the depth and/or concentration of ions implanted into the one or more target intermediate regions 504. For example, one or more acute implantation angles can be employed rather than the perpendicular angle shown in FIGS. 6A-6B. Further, where multiple Josephson junctions 102 are being formed, respective implantation angles (e.g., represented by "θ" in FIGS. 6A-6B) can be employed to implant different target intermediate regions 104. In accordance with various embodiments described herein, the ion species implanted via the one or more ion beams 602 can depend on the type of superconducting material comprised within the superconducting coupling line 116. Example ion species can include, but are not limited to: aluminum, iron, tin, cobalt, a combination thereof, and/or the like.

In various embodiments, the ion implantation executed during the third stage 600 of manufacturing can form the one or more ion implant regions 104. Thereafter, the one or more mask layers 502 can be removed via one or more removal processes to achieve the exemplary qubit structure 100 architecture shown in FIG. 1A.

Figure 7A:
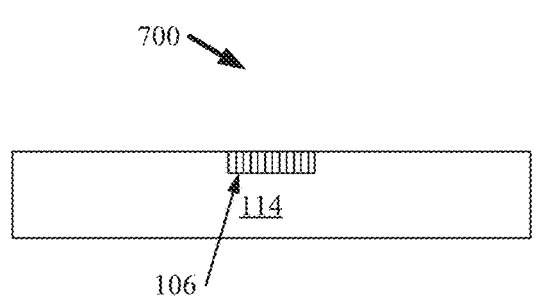
FIGS. 7A-7D illustrate diagrams of example, non-limiting cross-sectional views of a qubit structure during various stages of manufacturing in accordance with one or more embodiments described herein.

FIGS. 7A-7D illustrate diagrams of the example, non-limiting qubit structure 100 throughout a manufacturing process that employs the one or more sacrificial layers 106 in accordance with one or more embodiments described herein. Repetitive description of like elements employed in other embodiments described herein is omitted for sake of brevity. As shown in FIG. 7A, one or more embodiments can include an initial stage 700 of manufacturing in which the one or more sacrificial layers 106 can be positioned on the substrate 114.

Figure 7B:
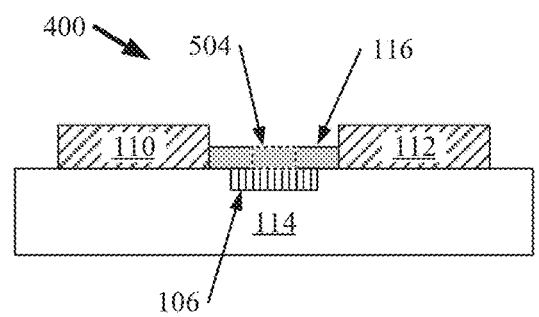

In various embodiments, the one or more sacrificial layers 106 can be implanted into the substrate 114 via one or more deposition processes during the initial stage 700 of manufacturing. For example, the one or more sacrificial layers 106 can be positioned on the substrate 114 at locations that can subsequently align with target intermediate regions 504 of the superconducting coupling line 116 (e.g., as shown in FIG. 7B). For example, FIG. 7B demonstrates that the first stage 400 of manufacturing can be implemented subsequent to the initial stage 700, where the first superconducting electrode 110 and the second superconducting electrode 112 can be deposited at positions adjacently aligned next to the one or more sacrificial layers 106. Further, during the first stage 400 of manufacturing, the one or more superconducting coupling lines 116 can be deposited over the one or more sacrificial layers 106 such that the one or more sacrificial layers 106 are aligned with, and underly, the one or more target intermediate regions 504.

Figure 7C:
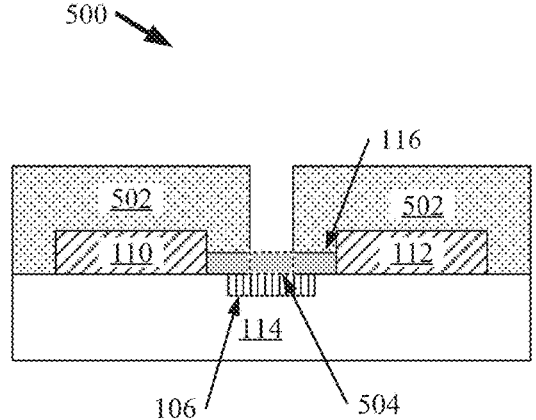
Figure 7D:
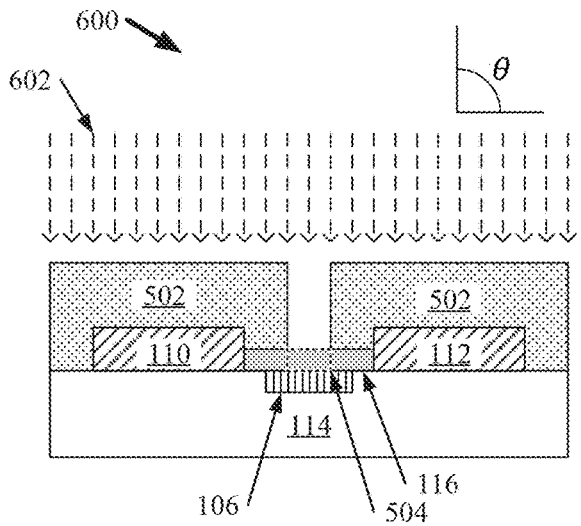

As shown in FIGS. 7C-7D, the second stage 500 and third stage 600 of manufacturing can be subsequently employed in accordance with the various embodiments described herein. During the ion implantation of the third stage 600, the one or more sacrificial layers 106 can absorb ions that over-penetrate the superconducting coupling line 116; thereby further shielding the substrate 114 from the ion beams 602. In various embodiments, the ion implantation executed during the third stage 600 of manufacturing can form the one or more ion implant regions 104. Thereafter, the one or more mask layers 502 can be removed via one or more removal processes to achieve the exemplary qubit structure 100 architecture shown in FIG. 1B.

Figure 8A:
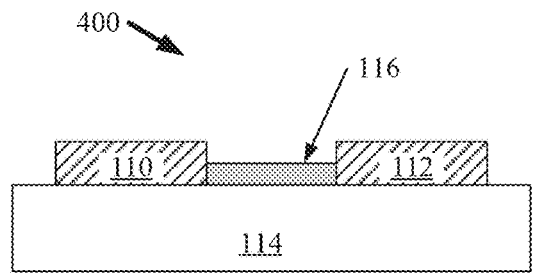
FIGS. 8A-8D illustrate diagrams of example, non-limiting cross-sectional views of a qubit structure during various stages of manufacturing in accordance with one or more embodiments described herein.
Figure 8B:
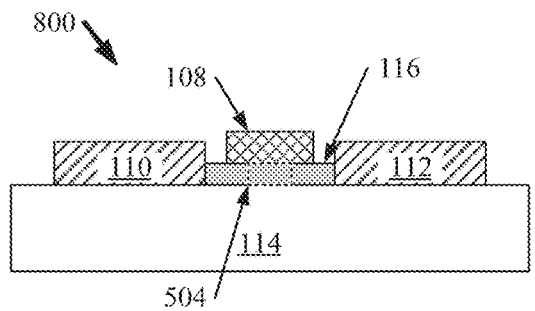

FIGS. 8A-8D illustrate diagrams of the example, non-limiting qubit structure 100 throughout a manufacturing process that employs the one or more metal cap layers 108 in accordance with one or more embodiments described herein. Repetitive description of like elements employed in other embodiments described herein is omitted for sake of brevity. As shown in FIG. 8B, one or more embodiments can include an intermediate stage 800 of manufacturing in which the one or more metal cap layers 108 can be positioned on the superconducting coupling line 116 and covering the one or more target intermediate regions 504.

Figure 8C:
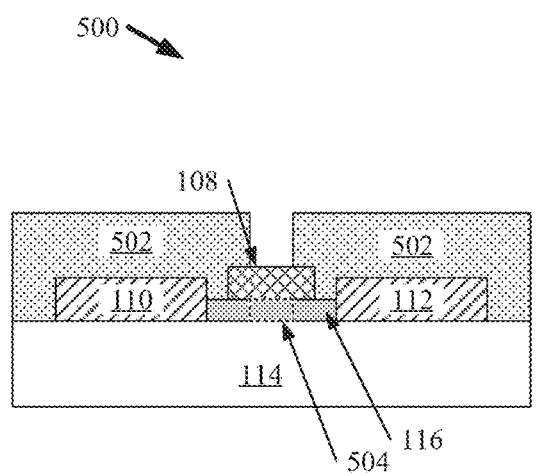
Figure 8D:
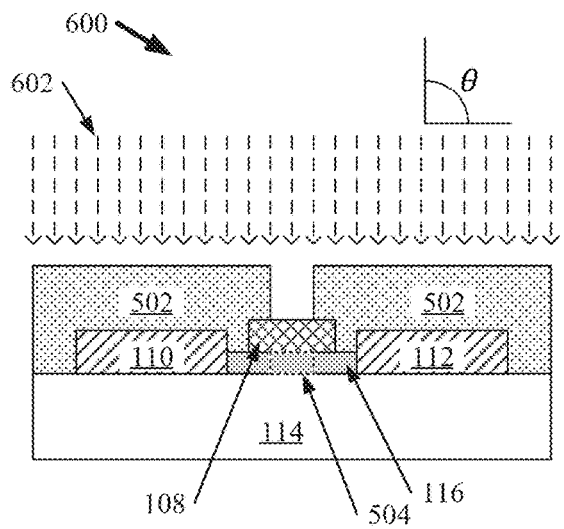

Subsequent to the first stage 400 of manufacturing, the intermediate stage 800 can be implemented to deposit the one or more metal cap layers 108 via one or more deposition processes (e.g., via PLD, CVD, ALD, evaporation, spin coating, and/or the like). As shown in FIG. 8B, the one or more metal cap layers 108 can be deposited directly onto the one or more superconducting coupling line 116 over the one or more target intermediate regions 504. Thereafter, the second stage 500 and third stage 600 of manufacturing can be implemented. For example, as shown in FIG. 8C, the one or more or more mask layers 502 can be deposited onto one or more portions of the metal cap layers 108 that are not aligned with a target intermediate region 504; whereas one or more other portions of the metal cap layers 108 that are aligned with a target intermediate region 504 can remain exposed (e.g., uncovered by the one or more mask layers 502).

During the ion implantation of the third stage 600, the one or more metal cap layers 108 can enhance control over ion migration; thereby enhancing control over the boundaries and/or composition of the resulting ion implant regions 104. In various embodiments, the ion implantation executed during the third stage 600 of manufacturing can form the one or more ion implant regions 104. Thereafter, the one or more mask layers 502 can be removed via one or more removal processes to achieve the exemplary qubit structure 100 architecture shown in FIG. 1C.

Figure 9A:
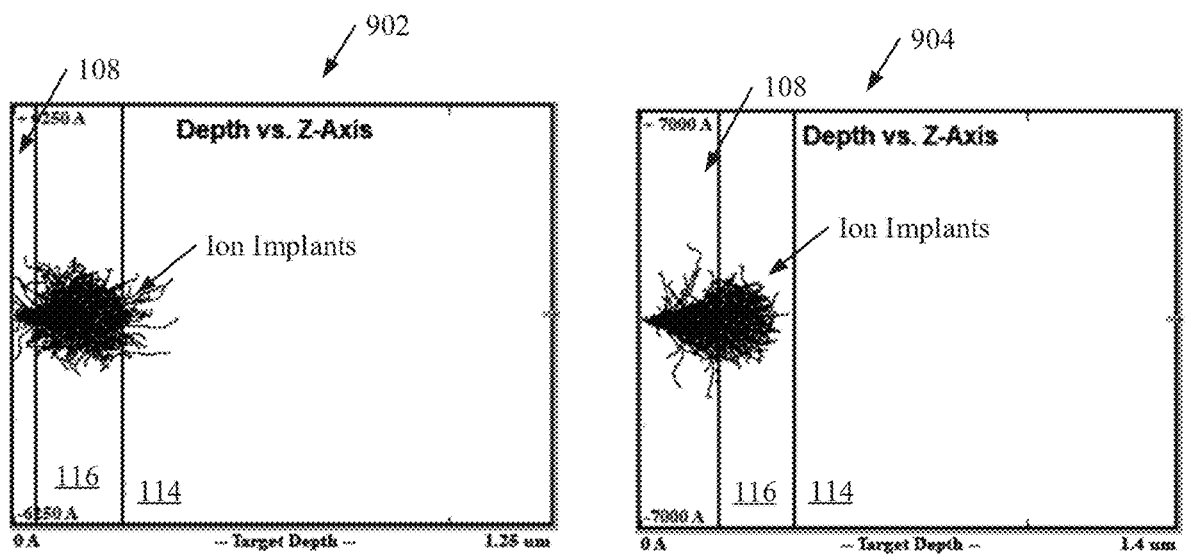
FIGS. 9A-9B illustrate diagrams of example, non-limiting images that can demonstrate control over ion implantation that can be achieved via one or more metal caps in accordance with one or more embodiments described herein.

FIG. 9A illustrates diagrams of example, non-limiting images 902, 904 that can demonstrate how the thickness (e.g., along the "Z" axis shown in FIGS. 1A-1D) of the one or more metal cap layers 108 can influence the ion implantation during the third stage 600 of manufacturing in accordance with one or more embodiments described herein. Repetitive description of like elements employed in other embodiments described herein is omitted for sake of brevity. Images 902 and 904 can characterize the qubit structure 100 having an aluminum metal cap layer 108, a niobium superconducting coupling line 116, and a silicon substrate 114, where aluminum ions are implanted during the third stage 600 of manufacturing via an ion implementation conducted at 200 kiloelectron volts ("keV"). With regards to image 902, the aluminum metal cap layer 108 is 50 nanometers (nm) thick. With regards to image 904, the aluminum metal cap layer 108 is 200 nm thick. Images 902 and 904 illustrate the depth of ion implantation into the superconducting coupling line 116 in relation to the thickness of the qubit structure 100 (e.g., along the "Z" axis). As shown in image 904, increasing the thickness of the one or more metal cap layers 108 can inhibit implantation of the ion species into the substrate 114 during formation of the ion implant regions 104.

Figure 9B:
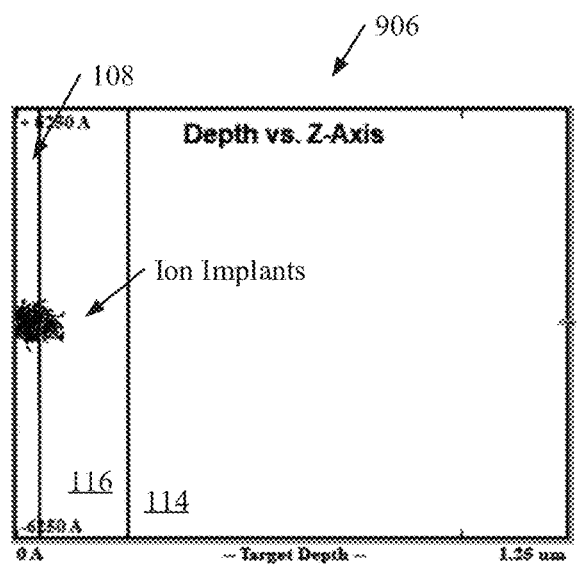

FIG. 9B illustrates a diagram of an example, non-limiting image 906 that can demonstrate how the implantation angle (e.g., represented by "θ" in FIGS. 6A-6B) can influence the ion implantation during the third stage 600 of manufacturing in accordance with one or more embodiments described herein. Repetitive description of like elements employed in other embodiments described herein is omitted for sake of brevity. Image 906 can characterize the qubit structure 100 having a tantalum metal cap layer 108, a niobium superconducting coupling line 116, and a silicon substrate 114, where aluminum ions are implanted during the third stage 600 of manufacturing via an ion implementation conducted at 200 kiloelectron volts ("keV"). The metal cap layer 108 characterized in image 906 can have the same thickness as the metal cap layer 108 characterized in image 902 (e.g., a thickness of 50 nm); however, the implantation angle (e.g., represented by "θ" in FIGS. 6A-6B) can vary between the ion implantation characterized by image 902 and the ion implantation characterized by image 906. As shown in image 906, altering the ion implantation angle can alter the depth of ion implantation. For example, image 906 can characterize an ion implantation that employed an acute implantation angle (e.g., represented by "θ" in FIGS. 6A-6B).

Figure 10A:
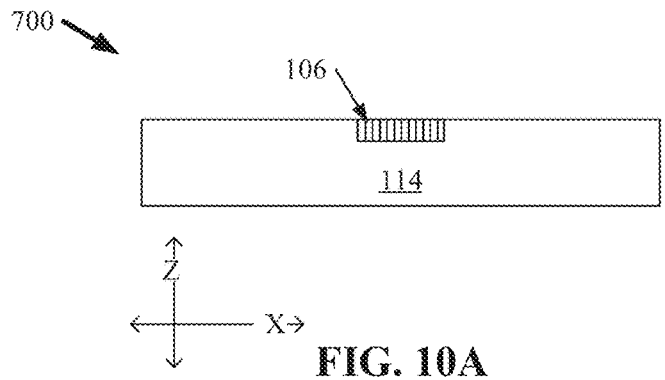
FIGS. 10A-10E illustrate diagrams of example, non-limiting cross-sectional views of a qubit structure during various stages of manufacturing in accordance with one or more embodiments described herein.
Figure 10B:
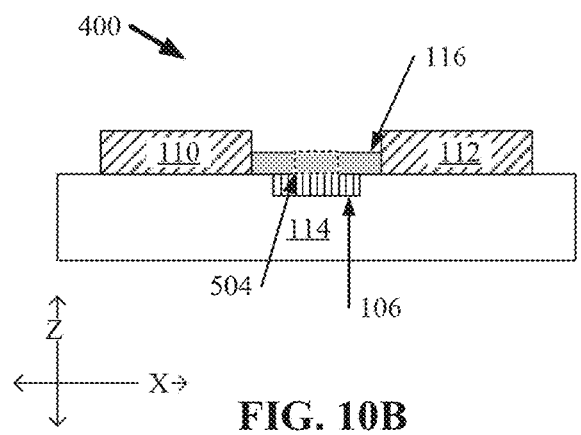
Figure 10C:
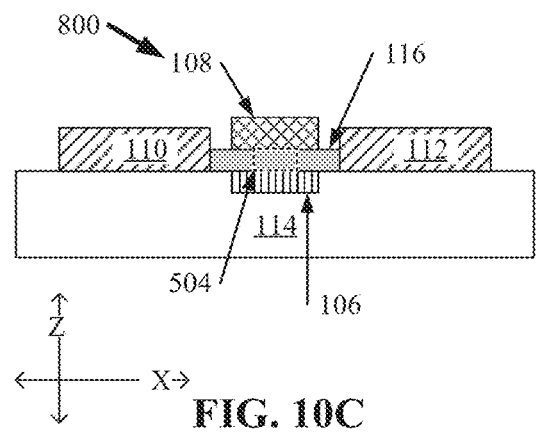
Figure 10D:
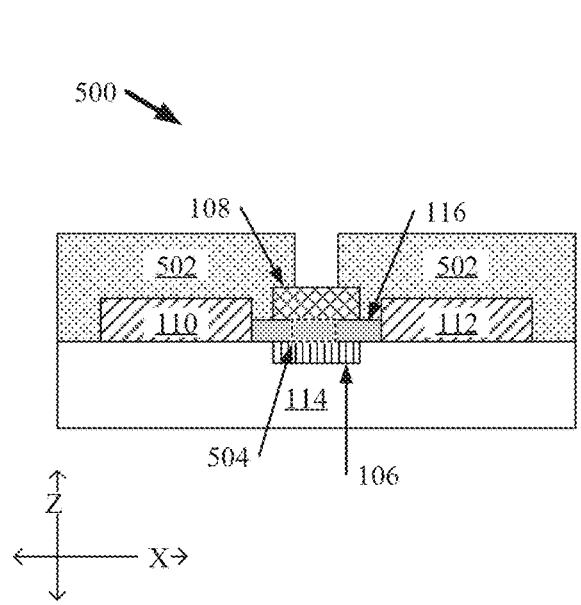
Figure 10E:
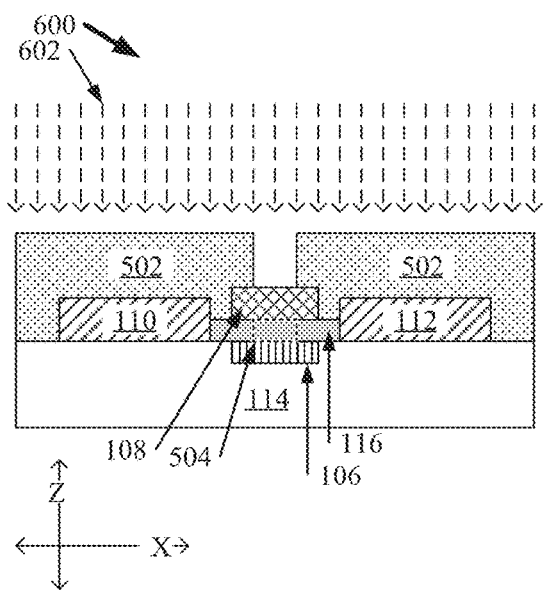

FIGS. 10A-10E illustrate diagrams of the example, non-limiting qubit structure 100 throughout a manufacturing process that employs both of the one or more sacrificial layers 106 and/or metal cap layers 108 in accordance with one or more embodiments described herein. Repetitive description of like elements employed in other embodiments described herein is omitted for sake of brevity. As shown in FIG. 10A, the qubit structure 100 manufacturing can include the initial stage 700, in which the one or more sacrificial layers 106 can be positioned on the substrate 114. Additionally, as shown in FIG. 10C, the qubit structure 100 manufacturing can further include the intermediate stage 800, in which the one or more metal cap layers 108 can be positioned on the superconducting coupling line 116 and covering the one or more target intermediate regions 504.

During the ion implantation of the third stage 600, the one or more sacrificial layers 106 can shield the substrate 114 from the ion species, and/or the one or more metal cap layers 108 can enhance control over the vertical and/or lateral straggle of the ion implantation. In various embodiments, the ion implantation executed during the third stage 600 of manufacturing can form the one or more ion implant regions 104. Thereafter, the one or more mask layers 502 can be removed via one or more removal processes to achieve the exemplary qubit structure 100 architecture shown in FIG. 1D.

FIG. 11 illustrates a flow diagram of an example, non-limiting method 1100 that can facilitate manufacturing of one or more qubit structures 100 in accordance with one or more embodiments described herein. Repetitive description of like elements employed in other embodiments described herein is omitted for sake of brevity. For example, method 1100 can employ one or more sacrificial layers 106 in accordance with the various embodiments described herein to achieve one or more embodiments of the qubit structure 100 (e.g., such as the architectures exemplified in FIGS. 1B, 1D, and/or 3.

At 1102, the method 1100 can comprise implanting one or more sacrificial layers 106 into a substrate 114. As described in various embodiments herein, the one or more sacrificial layers 106 can be deposited via one or more deposition processes and/or can comprise one or more materials that can absorb an ion species subsequently employed in one or more ion implantations. Further, the one or more sacrificial layers 106 can be removed (e.g., via one or more removal processes) at the conclusion of the method 1100. In various embodiments, 1102 can be exemplified by the initial stage 700 of manufacturing described herein.

At 1104, the method 1100 can comprise forming one or more first superconducting electrodes 110 on the substrate 114. At 1106, the method 1100 can comprise forming one or more second superconducting electrodes 112 on the substrate 114, where the one or more sacrificial layers 106 can be between the one or more first superconducting electrodes 110 and second superconducting electrodes 112. At 1108, the method 1100 can comprise forming a strip of superconducting material (e.g., a superconducting coupling line 116) by depositing superconducting material onto the one or more sacrificial layers 106 via one or more deposition processes. In various embodiments, 1104-1108 can be exemplified by the first stage 400 of manufacturing described herein. For instance, FIG. 7B depicts depositing the strip of superconducting material (e.g., superconducting coupling line 116) onto the one or more sacrificial layers 106. In one or more embodiments, the forming at 1104-1108 can be facilitated by one or more deposition processes and/or lithography processes.

At 1110, the method 1100 can comprise exposing one or more ion implant regions 104 of the strip of superconducting material (e.g., superconducting coupling line 116) to one or more ion beams 602, where the one or more sacrificial layers 106 can shield the substrate 114 from the one or more ion beams 602. For example, one or more mask layers 502 can coat the one or more first superconducting electrodes 110, second superconducting electrodes 112, and/or portions of the strip of superconducting material (e.g., superconducting coupling line 116), where target intermediate portions 502 of the strip of superconducting material (e.g., superconducting coupling line 116) can be left uncovered and exposed to the one or more ion beams 602. In various embodiments, 1110 can be exemplified by the second stage 500 and/or third stage 600 of manufacturing described herein. For instance, FIGS. 7C-7D can depict the exposing at 1110.

FIG. 12 illustrates a flow diagram of an example, non-limiting method 1200 that can facilitate manufacturing of one or more qubit structures 100 in accordance with one or more embodiments described herein. Repetitive description of like elements employed in other embodiments described herein is omitted for sake of brevity. For example, method 1200 can employ one or more metal cap layers 108 in accordance with the various embodiments described herein to achieve one or more embodiments of the qubit structure 100 (e.g., such as the architectures exemplified in FIGS. 1C, 1D, and/or 3.

At 1202, the method 1200 can comprise forming one or more first superconducting electrodes 110 and/or second superconducting electrodes 112 on a substrate 114. At 1204, the method 1200 can comprise forming a strip of superconducting material (e.g., a superconducting coupling line 116) that can couple the first superconducting electrode 110 to the second superconducting electrode 112. In various embodiments, 1202-1204 can be exemplified by the first stage 400 of manufacturing described herein. For instance, FIG. 8A depicts depositing the first superconducting electrode 110, second superconducting electrode 112, and/or strip of superconducting material (e.g., superconducting coupling line 116) on the substrate 114. For instance, the forming at 1202-1204 can be performed via one or more deposition processes and/or lithography processes.

At 1204, the method 1200 can comprise depositing one or more metal masks (e.g., metal cap layers 108) onto one or more regions (e.g., target intermediate regions 504) of the strip of superconducting material (e.g., superconducting coupling line 116). In various embodiments, the depositing at 1204 can be exemplified by the intermediate stage 800 described herein. For example, FIG. 8B can depict the depositing at 1204.

At 1206, the method 1200 can comprise exposing the one or more metal masks (e.g., metal cap layers 108) to one or more ion beams 602, where the one or more ion beams 602 can implant one or more ions into the strip of superconducting material (e.g., into the one or more target intermediate regions 504) to form a Josephson junction 102 (e.g., form the one or more ion implant regions 104, and thereby one or more Josephson junctions 102). For example, one or more mask layers 502 can coat the one or more first superconducting electrodes 110, second superconducting electrodes 112, metal masks (e.g., metal cap layers 108) and/or portions of the strip of superconducting material (e.g., superconducting coupling line 116), where target intermediate portions 502 of the strip of superconducting material (e.g., superconducting coupling line 116) can be left uncovered and exposed to the one or more ion beams 602. In various embodiments, 1208 can be exemplified by the second stage 500 and/or third stage 600 of manufacturing described herein. For instance, FIGS. 8C-8D can depict the exposing at 1208.

In various embodiments, one or more features of method 1100 can be combined with one or more features of method 1200 to achieve one or more embodiments of the qubit structure 100. For instance, FIGS. 8A-8D exemplify how 1102 can be incorporated into method 1200 to achieve a qubit structure 100 exemplified in FIGS. 1D and/or 3.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What is claimed is:

1. An apparatus, comprising:
a strip of superconducting material coupling a first superconducting electrode on a substrate and a second superconducting electrode on the substrate, the strip of superconducting material having a first region comprising an ion implant and a second region that is free from the ion implant; and
a sacrificial layer within a first portion of the substrate that is below a second portion of the strip of superconducting material comprising the first region.

2. The apparatus of claim 1, wherein a superconducting order parameter of the strip of superconducting material is smaller in the first region than in the second region.

3. The apparatus of claim 1, wherein the first region is a Josephson junction of a superconducting qubit.

4. The apparatus of claim 1, wherein the strip of superconducting material comprises a third region that comprises a second ion implant, and wherein the second region is positioned between the first region and the third region.

5. The apparatus of claim 4, wherein the ion implant and the second ion implant are the same ion species.

6. The apparatus of claim 1, wherein the strip of superconducting material comprises at least one material selected from a first group consisting of aluminum and niobium, and wherein the ion implant is a member selected from a second group consisting of: an aluminum ion, a tantalum ion, an iron ion, a tin ion, and a cobalt ion.

7. The apparatus of claim 1, further comprising:
a metal layer positioned on the strip of superconducting material, wherein a metal of the metal layer and the ion implant comprise a same metallic element.

8. A method, comprising:
forming a Josephson junction of a superconducting qubit, wherein the forming comprises:
forming a first superconducting electrode on a substrate,
forming a second superconducting electrode on the substrate,
forming a strip of superconducting material by depositing superconducting material onto the substrate that couples the first superconducting electrode to the second superconducting electrode, and
implanting an ion into a region of the strip of superconducting material by depositing a metal mask onto the region of the strip of superconducting material, and exposing the metal mask to an ion beam.

9. The method of claim 8, further comprising:
prior to forming the first superconducting electrode, the second superconducting electrode, and the strip of superconducting material on the substrate, forming a sacrificial layer within a portion of the substrate below where the region of the strip of superconducting material will be formed on the substrate forming the first superconducting electrode on the substrate.

10. The method of claim 9, further comprising:
wherein forming the strip of superconducting material comprises depositing some of the superconducting material onto the sacrificial layer.

11. The method of claim 9, wherein the sacrificial layer shields the substrate from the ion beam.

12. The method of claim 8, wherein the strip of superconducting material comprises at least one material selected from a first group consisting of aluminum and niobium, and wherein the ion selected from a second group consisting of: an aluminum ion, a tantalum ion, an iron ion, a tin ion, and a cobalt ion.

13. A method, comprising:
forming a sacrificial layer within a first portion of a substrate;
forming a first superconducting electrode and a second superconducting electrode on the substrate;
forming a strip of superconducting material that couples the first superconducting electrode to the second superconducting electrode, comprising depositing a second portion of the strip of superconducting material on the sacrificial layer; and
forming a Josephson junction in the strip of superconducting material by implanting an ion into the strip of superconducting material.

14. The method of claim 13, further comprising:
depositing a metal mask onto the second portion of the strip of superconducting material; and
exposing the metal mask to an ion beam.

15. The method of claim 13, wherein the forming the Josephson junction comprises exposing a region in the second portion of the strip of superconducting material to an ion beam, wherein the sacrificial layer shields the substrate from the ion beam.

16. The method of claim 13, wherein the strip of superconducting material comprises at least one material selected from a first group consisting of aluminum and niobium, and wherein the ion selected from a second group consisting of: an aluminum ion, a tantalum ion, an iron ion, a tin ion, and a cobalt ion.

17. The method of claim 14, wherein a metal of the metal mask and an ion element of the ion beam comprise a same metallic element.

18. The method of claim 15, wherein a superconducting order parameter of the strip of superconducting material is suppressed in the region.

19. The method of claim 8, wherein a metal of the metal mask and an ion element of the ion beam comprise a same metallic element.

20. The method of claim 8, wherein a superconducting order parameter of the strip of superconducting material is suppressed in the region.

* * * * *